(12) United States Patent
Deckers

(10) Patent No.: US 11,424,223 B2
(45) Date of Patent: Aug. 23, 2022

(54) LED LIGHTING ARRANGEMENT

(71) Applicant: Lumileds LLC, San Jose, CA (US)

(72) Inventor: Michael Deckers, Jülich (DE)

(73) Assignee: Lumileds LLC, San Jose, CA (US)

( * ) Notice: Subject to any disclaimer, the term of this patent is extended or adjusted under 35 U.S.C. 154(b) by 289 days.

(21) Appl. No.: 16/681,144

(22) Filed: Nov. 12, 2019

(65) Prior Publication Data

US 2020/0152613 A1  May 14, 2020

(30) Foreign Application Priority Data

Nov. 12, 2018 (EP) .................................... 18205661

(51) Int. Cl.

| | |
|---|---|
| *H01L 33/00* | (2010.01) |
| *H01L 25/075* | (2006.01) |
| *F21S 41/153* | (2018.01) |
| *F21S 45/47* | (2018.01) |
| *F21S 41/20* | (2018.01) |
| *H01L 21/48* | (2006.01) |
| *H01L 23/498* | (2006.01) |
| *H01L 23/538* | (2006.01) |
| *H01L 25/16* | (2006.01) |
| *H01L 33/60* | (2010.01) |
| *H01L 33/62* | (2010.01) |
| *H01L 33/64* | (2010.01) |
| *F21Y 105/16* | (2016.01) |
| *F21Y 103/10* | (2016.01) |
| *F21Y 115/10* | (2016.01) |
| *H01L 33/56* | (2010.01) |

(52) U.S. Cl.
CPC ........ *H01L 25/0753* (2013.01); *F21S 41/153* (2018.01); *F21S 41/285* (2018.01); *F21S 45/47* (2018.01); *H01L 21/486* (2013.01); *H01L 23/49866* (2013.01); *H01L 23/5384* (2013.01); *H01L 23/5386* (2013.01); *H01L 25/167* (2013.01); *H01L 33/60* (2013.01); *H01L 33/62* (2013.01); *H01L 33/644* (2013.01); *F21Y 2103/10* (2016.08); *F21Y 2105/16* (2016.08); *F21Y 2115/10* (2016.08); *H01L 33/56* (2013.01); *H01L 2933/0066* (2013.01); *H01L 2933/0075* (2013.01)

(58) Field of Classification Search
CPC ............. H01L 25/0753; H01L 23/5384; H01L 23/49866; F21Y 2103/10
See application file for complete search history.

(56) References Cited

U.S. PATENT DOCUMENTS

| | | |
|---|---|---|
| 2013/0328070 A1 | 12/2013 | Hussell et al. |
| 2014/0062318 A1 | 3/2014 | Tischler et al. |
| 2017/0015435 A1 | 1/2017 | Jha et al. |

*Primary Examiner* — Samuel A Gebremariam
(74) *Attorney, Agent, or Firm* — Volpe Koenig

(57) ABSTRACT

The invention describes an LED lighting arrangement comprising a single-layer carrier comprising a mounting surface, a metal core, and a dielectric layer between the mounting surface and the metal core; at least one LED string comprising a plurality of series-connected LED die packages mounted on the mounting surface, wherein the LED die packages of a string are arranged in a two-dimensional array comprising at least two rows; and at least one micro-via extending through the dielectric layer of the single-layer carrier and arranged to electrically connect the final cathode of an LED string to the metal core of the single-layer carrier. The invention further describes a lighting unit; and a method of manufacturing an LED lighting arrangement.

18 Claims, 5 Drawing Sheets

LED LIGHTING ARRANGEMENT

FIELD OF INVENTION

The invention describes an LED lighting arrangement; an LED lighting unit; and a method of manufacturing an LED lighting arrangement.

BACKGROUND

Arrays of high-power light-emitting diodes (LEDs) are becoming more widely used in applications such as camera flashes, automotive exterior lighting, etc. While it is possible to manufacture an array die package comprising individually addressable LEDs, it may be preferred to assemble an array of individual die packages, since this approach affords many more possibilities. The LEDs of such an array or matrix can be connected in a parallel configuration comprising a common anode and a common cathode. Alternatively, the LEDs may be connected in series. To individually address each LED of the array, each LED may be connected in parallel to a bypass switch so that the LEDs can be individually switched on or off as appropriate. Such a realisation may be used in an adaptive driving beam (ADB) application for an automotive front lighting unit or rear lighting unit. In such high-power applications, the LEDs may be realised for currents exceeding 200 mA.

In a prior art LED die package matrix, the array size can be kept relatively compact by arranging circuit tracks in two or more routing layers of a carrier or substrate such as a multi-layer printed circuit board (PCB) or an insulated metal substrate (IMS), so that not all tracks need to be routed between the dies. However, LEDs become very hot during operation, and efficient thermal transport is necessary. A disadvantage of the prior art arrangements is that any heat spreader, heat sink or thermal block must be arranged underneath the PCB, but the dielectric layers that separate any two routing levels of the PCB are also thermally insulating. The thickness of such a dielectric layer is generally in the order of 50-100 µm for IMS boards since it must provide reliable electrical insulation between the routing levels. As a result, heat from the LEDs cannot be effectively transported to the heat spreader, so that the LEDs can reach unfavourably high temperatures and the lifetime of the LEDs may be shortened. It is not possible to effectively transport the heat from very densely-arranged LED packages mounted on a multi-layer PCB. As a result, any LEDs arranged towards the centre of the array may have a significantly shorter lifetime since these are also heated by any hot neighbouring LEDs, so that these centrally arranged LEDs may fail even sooner because of thermal damage. For these reasons, the LED die packages of such matrix arrays are generally spaced apart by a significant distance in order to allow heat to dissipate from the LEDs.

Therefore, the individual light sources in the matrix will effectively be separated by a noticeable distance so that the matrix is relatively large, and the array structure will be clearly visible unless a suitable bundling or collimating optical element is used to shape the light from the individual LED dies into a single "virtual" light source. In applications such as automotive lighting, for example, a matrix LED lighting arrangement can comprise an LED array or matrix, a collimating element that "bundles" the individual contributions into a single beam, and an imaging lens to manipulate the beam in the desired manner, for example to comply with applicable regulations. Because of the relatively large matrix size, the size of any such collimating element or the size of any such lens will also be correspondingly large, adding to the overall weight and cost of the application.

Therefore, it is an object of the invention to provide an improved addressable LED matrix arrangement.

SUMMARY

The object of the invention is achieved by the LED lighting arrangement of claim 1; by the lighting unit of claim 12, and by the method of claim 14 of manufacturing an LED lighting arrangement.

According to the invention, the LED lighting arrangement comprises a single-layer carrier comprising a mounting surface, a metal core, and a dielectric layer between the mounting surface and the metal core; at least one LED string comprising a plurality of series-connected LED die packages mounted on the mounting surface, wherein the LED die packages of a string are arranged in a two-dimensional array comprising at least two rows; and at least one micro-via extending through the dielectric layer of the single-layer carrier and arranged to electrically connect the final cathode of an LED string to the metal core of the single-layer carrier.

A micro-via is generally a very small cylindrical metal-lined through-opening that extends into a multi-layer substrate such as a printed circuit board. Usually, a micro-via is used to connect a conductive track at one level of the substrate to a conductive track embedded at another level within the substrate. In the context of the invention, the substrate or carrier may be assumed to be a single-layer substrate that has tracks formed only from a metal layer deposited on its mounting surface, and it shall be understood that any micro-via extends from the mounting surface (front or top surface) of the substrate through to the metal core embedded in the substrate. The micro-via is therefore a "blind" via, since it commences at the mounting surface and terminates inside the body of the substrate, i.e. it does not extend to the opposite surface of the substrate. The single-layer substrate shall be understood to not comprise any embedded layers with conductive tracks. The single-layer substrate shall be understood to comprise a single thin layer of dielectric material which serves to electrically isolate the upper metal layer (from which conductive tracks are etched) from the metal core or metal base layer (which provides structural strength and also serves to dissipate heat). Such a PCB is generally referred to as a single-layer insulated metal substrate (IMS) or a single-layer metal core PCB (MCPCB).

The cathode of the final LED of a two-dimensional LED array must be connected to electrical ground. From the known designs, this grounding track would have to be placed to the side of the final LEDs of a two-dimensional LED array. Since the width of a printed track on a substrate can be 60 µm-500 µm in width, the need to provide such a track means that a corresponding gap must be provided between the final LEDs of a first two-dimensional LED array and a second, neighbouring LED array. This problem is overcome by the inventive LED lighting arrangement since the final cathode of a first LED string is electrically connected to the grounding thermal dissipation block through a micro-via in the substrate. As a result, there is no need to provide a conductive track from this final LED along the mounting surface and to a ground terminal. The LEDs of a second, neighbouring LED array can therefore be placed very close to the final LEDs of the first string or two-dimensional array. In this way, a more compact arrangement can be achieved, i.e. the LED die packages can be packed more densely. With the inventive LED lighting arrangement, adjacent LEDs can be arranged very close together, and can be separated by a gap of less than 100 μm. Adjacent LEDs may even be separated by a gap as small as 40 μm. This means that the inventive LED lighting arrangement allows the use of high-power LED dies with very thin side-coats, for example side-coats with a thickness of less than 100 μm. With such thin side coats, the closely packed array of LED die packages does not need a bundling optical element to form a homogenous beam of light, so that the inventive LED lighting arrangement can be used in a direct projection system, i.e. in a lighting unit that does not include a bundling optical element between the LEDs and an imaging lens. Strings of LED dies can be arranged in a matrix to give a very efficient and compact array of individually addressable LEDs. LED dies can be used, for which the package size is the same size as, or only slightly larger than, the size of the emission surface.

According to the invention, the lighting unit comprises an embodiment of the inventive LED lighting arrangement; an interface for connecting the LEDs of the series-connected LED die package strings to a controller; and an imaging lens.

Because of the spatially close arrangement obtained by providing a micro-via in the substrate to connect the final LED of a string to the metal core of single-layer substrate as described above, the individual arrays will not be identifiable as such in the light beam leaving the lighting unit, even without a collimating optical element. Instead, the light from the LEDs and the LED arrays will advantageously appear to originate from a single light source. The inventive LED lighting arrangement can therefore be realised as a direct projection system, i.e. a lighting unit that does not require a collimating optical element. A comparable prior art lighting unit requires a collimating or bundling optical element to correct for the gap between neighbouring two-dimensional LED arrays, and suffers from a corresponding reduction in efficiency.

According to the invention, the method of manufacturing an LED lighting arrangement comprises the steps of providing a single-layer carrier comprising a mounting surface, a metal core, and a dielectric layer between the mounting surface and the metal core; forming tracks on the carrier for a number of series-connected LED die package strings such that the LED die packages of a string are arranged in a two-dimensional array; determining the position of a final cathode of an LED string; forming a micro-via at each determined position to extend through the dielectric layer of the single-layer carrier; and mounting the LED die packages onto the carrier at their designated positions.

The inventive method provides a solution to the technical challenge of how to achieve an array of very closely spaced and individually addressable emitters on a single-layer substrate, i.e. how to achieve the electrical routing of multiple rows of LED die packages using only a single routing layer. Such densely packed arrays of individually addressable LED die packages are desirable in applications such as ADB or "matrix light" applications, since the close packing of the LED die packages means that the application does not require a pre-collimator optical element, and can therefore be realised in a more compact and economical manner.

The dependent claims and the following description disclose particularly advantageous embodiments and features of the invention. Features of the embodiments may be combined as appropriate. Features described in the context of one claim category can apply equally to another claim category.

In a particularly preferred embodiment of the invention, an LED die package is a surface-mount wafer-level package with anode and cathode solder contacts on its lower surface, i.e. the side opposite the emission surface. In the following, without restricting the invention in any way, the terms "LED die package", "emitter" and "LED" may be used interchangeably. Preferably, an LED die package comprises a high-power LED, i.e. an LED with a current density of 500-1500 mA/mm$^2$.

The side walls of a wafer-level LED die package are generally coated with a material such as titanium dioxide (TiO$_2$) to improve the light output from the die and also to hermetically seal the side surfaces of the die. The package size of an LED die is determined by the thickness of any side coat around the four sides of the die. Presently available LED dies can have a TiO$_2$ side coat thickness in the region of 200 μm or more. In a further preferred embodiment of the invention, the side coat comprises a thin-film reflective coating, which can be realised to a thickness of 10 μm or less.

In a preferred embodiment of the inventive LED lighting arrangement, a side coat can be applied to the LEDs after assembly, i.e. after the LEDs are mounted in closely-packed two-dimensional arrays on the substrate. This can be achieved by filling the gaps between adjacent LEDs with a fluid silicone material containing reflective TiO$_2$ particles. The fluid silicone will be drawn into the gaps by capillary action, and is then allowed to cure.

With such a thin side-coat, and assuming that thermal requirements are fulfilled, the emission surfaces of the dies can be brought very close together and are separated by only a small distance. For example, using a suitably thin side coating, adjacent LEDs are preferably separated by at most 100 μm, more preferably by at most 50 μm. In an array in which the LEDs of a string are arranged in a staggered fashion, the expression "adjacent LED" is to be understood as the array neighbour of an LED, since an adjacent LED is not necessarily the string neighbour of an LED.

As indicated above, the LEDs of a string of series-connected LED die packages are preferably individually addressable. To this end, the inventive LED lighting arrangement preferably comprises a switch for each LED. A switch can be a suitable transistor, preferably a MOSFET, and is preferably controlled by a suitable signal originating from a controller. Any such switches can also be mounted on the same substrate as the LED array. Preferably, the switches can be provided in the form of an integrated circuit component. Similarly, a controller may be provided in the form of an integrated circuit component.

The inventive LED lighting arrangement preferably comprises at least two strings of series-connected LED die packages, more preferably at least four strings of series-connected LED die packages, wherein a string comprises at least two series-connected LED die packages, more preferably at least six series-connected LED die packages, most preferably at least twelve series-connected LED die packages. In an exemplary preferred embodiment of the invention, the LED lighting arrangement comprises four strings of twelve series-connected LED die packages, and the final cathode of each string is electrically connected to a micro-via, which in turn is electrically connected to the metal core of the single-layer substrate. In this exemplary preferred embodiment, the two-dimensional array is a 4×12 array formed by arranging the dies of each 12-LED string in a staggered 2×6 array configuration. An advantageous side-effect of the inventive LED lighting arrangement is that the final cathode of each string is also thermally connected to the metal core of the single-layer substrate.

The single-layer substrate or carrier can comprise any suitable substrate such as a PCB or a ceramic carrier. In a particularly preferred embodiment of the invention, the substrate is an insulated metal substrate (IMS) with a single dielectric layer and a single routing layer on its upper surface. An IMS comprises a thin layer of dielectric such as FR-4 epoxy applied onto a metal core or baseplate such as copper or aluminium, and a layer of metal (usually copper) applied onto the outer surface of the dielectric layer. The pattern of conductive tracks for the LEDs is etched from this metal layer. The metal core or baseplate can be thermally connected to a heat spreader using fasteners and/or a thermal adhesive. An IMS provides superior heat dissipation compared to a multi-level PCB, and ensures optimal thermal connection to the heat spreader.

Preferably, a micro-via comprises a metal-lined through-opening extending through the substrate from its mounting surface to the metal core of the single-layer carrier. For optimal thermal conduction, the micro-via metal is preferably copper. The diameter of a micro-via is preferably in the order of 50 µm to 200 µm. The micro-via may be completely filled with metal, or its side walls may be lined with metal to a thickness that is less than the radius of the micro-via.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWING(S)

In the drawings, like numbers refer to like objects throughout. Objects in the diagrams are not necessarily drawn to scale.

DETAILED DESCRIPTION OF THE PREFERRED EMBODIMENT(S)

Figure 1:
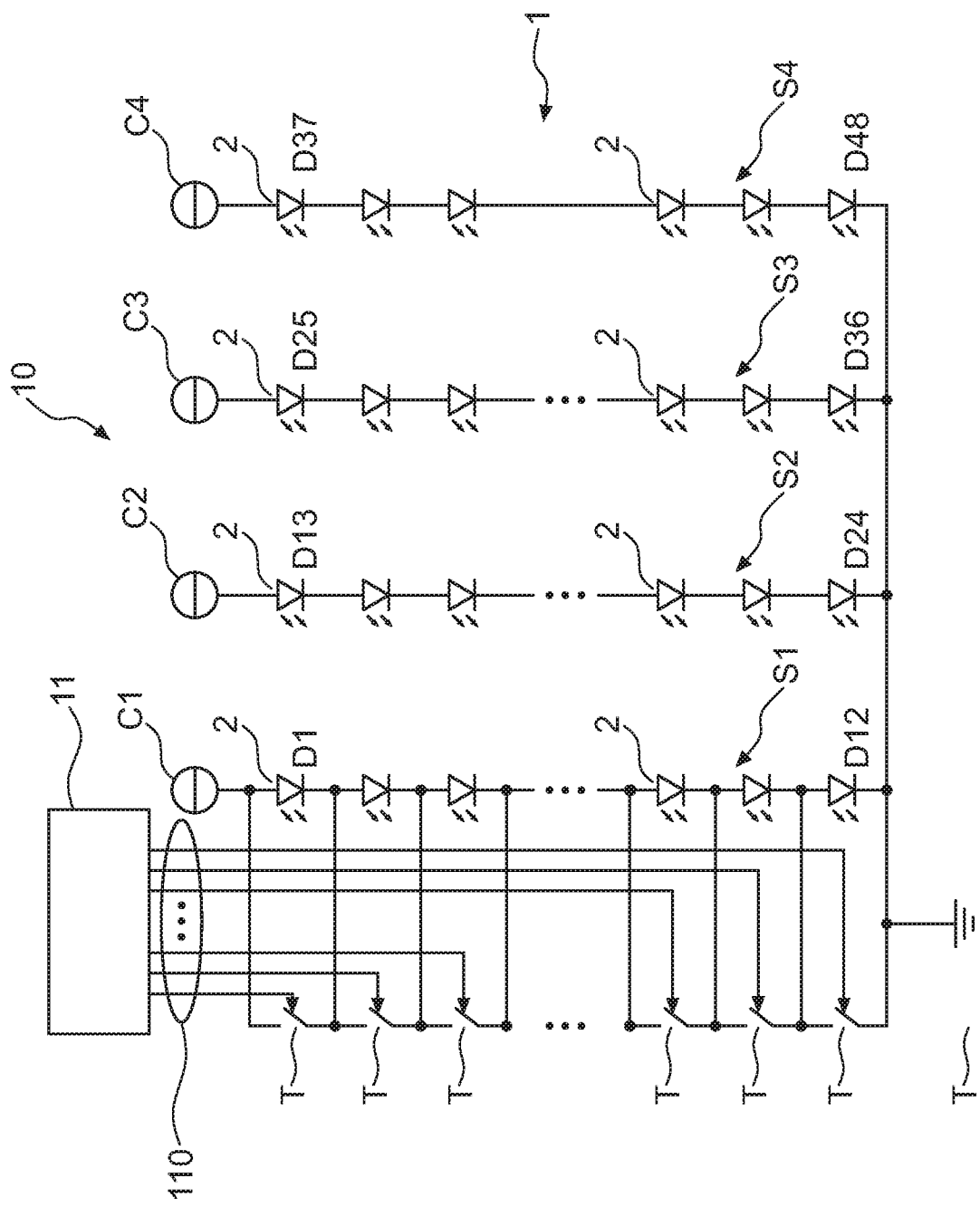
FIG. 1 shows a circuit diagram of an embodiment of the inventive LED lighting arrangement.

FIG. 1 shows a circuit diagram of an embodiment of the inventive LED lighting arrangement 10. The LED lighting arrangement 10 comprises an LED die array 1 comprising four series-connected strings S1, S2, S3, S4 of surface-mount wafer-level package LED dies 2, with twelve LEDs in each string. The first string S1 comprises LEDs labelled D1-D12; the second string S2 comprises LEDs labelled D13-D24, etc. In this exemplary embodiment, the LED lighting arrangement 10 further comprises a controller 11 realised to individually address each LED 2. Each string S1, S2, S3, S4 is driven by a corresponding current source C1, C2, C3, C4. The terminating cathode of each LED string S1, S2, S3, S4 is connected to a common ground. This is achieved by connecting the final LED 2 of each string S1, S2, S3, S4 to the metal core of a single-layer carrier such as IMS or MCPCB be means of a micro-via. Each LED 2 can be bypassed by means of a suitable switch element such as a transistor T. For the sake of clarity, only a few switch elements T of the first string S1 are shown, but it may be assumed that each LED 2 of each string S1, S2, S3, S4 is provided with a corresponding switch element T. As will be known to the skilled person, the switches T for the strings S1-S4 may comprise MOSFETs or other suitable transistors and may be provided in the form of an integrated circuit component. The controller 11 is realised to switch each LED 2 individually by appropriate control of the corresponding switch element T. In this way, the LED array 1 can be used in an active dynamic beam (ADB) application of an automotive front lighting unit, for example. The LED array 1 and controller 11 can be provided in a common package, or the LED die array 1 can be mounted on a substrate and provided with a control interface 110 such as a flat cable or socket for connection to a controller 11, for example.

Figure 2:
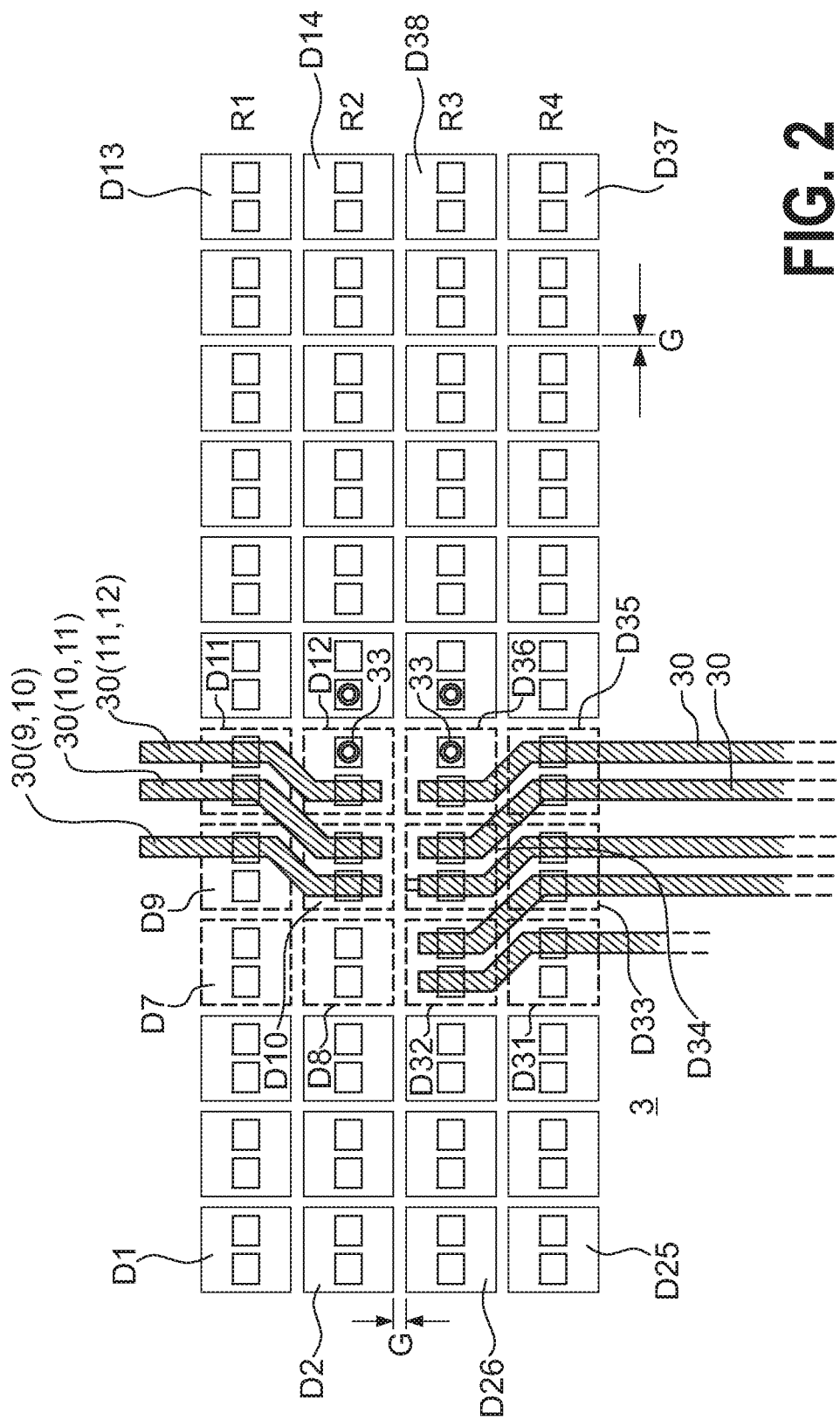
FIG. 2 shows a single-layer substrate patterned to receive LEDs of the LED lighting arrangement of FIG. 1.

FIG. 2 shows part of a single-layer PCB 3 with a pattern of conductive tracks 30 to receive the four strings of twelve series-connected LEDs 2 of FIG. 1 above. The LEDs will be mounted in four rows R1-R4. Future LEDs are indicated by rectangles, some of which are labelled in the drawing. Each set of twelve LEDs will be arranged over two rows in a zig-zag manner, with consecutive LEDs in different rows. The LED array of FIG. 1 will therefore appear as a 4×12 array which in turn comprises four 2×6 sub-arrays. For example, a twelve LED string may start in the top left corner of the uppermost row R1. The last six LEDs in that string will be placed at positions labelled D7, D8, D9, D10, D11, D12 (in that order). A conductive track will connect the anode of the first LED of a string to a current source (not shown). A further track segment connects the cathode of the first LED to the anode of the second LED of that string, and the cathode of the second LED is connected to the anode of the third LED, etc. The series-connections continue in this manner until the final LED of that string is reached (at position D12 in row R2). For the sake of clarity, only a few such tracks are shown: track 30(9, 10) will connect the cathode of an LED at position D9 to the anode of an LED at position D10; track 30(10, 11) will connect the cathode of an LED at position D10 to the anode of an LED at position D11; track 30(11, 12) will connect the cathode of an LED at position D11 to the anode of an LED at position D12. The cathode of the final LED of the first string (at position D12) will be electrically connected to the metal of a blind micro-via 33 that has been formed to lie directly under the cathode contact of the LED at position labelled D12. In a similar fashion, a blind micro-via 33 is shown to lie directly under the cathode contact of the final LED of the third string at position labelled D36. For the purposes of illustration, small rectangle pairs (within the rectangles indicating future LED positions) correspond to the positions of the anode and cathode contact pads of the LED die packages that will be mounted at positions D10, D12, D32, D34, D36. The cathode contact of the final LED die package of each string will be directly over a blind micro-via 33.

The diagram shows the tracks 30 extending outwards from the array of LED positions for connecting the LEDs to switches of a switch module as described in FIG. 1 above. The switches will allow each LED to be addressed, i.e. switched on/off as appropriate. By mounting the LEDs onto a thin single-layer MCPCB 3 and by electrically connecting the final cathode of each string to the metal core of the thin single-layer PCB 3 by means of the blind micro-vias 33, the thermal requirements can be fulfilled even when a very tight packing density is applied. The gap G separating the LEDs can be as small as 50 µm to 100 µm. The sides of the LED die packages may be supplied with a thin film reflective coating, with a thickness of less than 10 µm. The width of the gap G between emission surfaces can comprise two side-coat thicknesses and empty space in between. Alternatively, instead of empty space or air between the sides of adjacent coated LEDs, the space can be filled with a suitable insulating material such as silicone. As described above, LED side coats can be formed by pouring silicone (containing $TiO_2$ particles) into the gaps between LED dies after mounting onto the carrier. Because of the efficient heat transfer through the single-layer PCB 3, the surface-mount wafer-level package LED dies can be arranged very close together. With a thin side coat of up to 10 µm and a gap G of only 50-100 µm, and no need for a conductive track from the final LED of a string to an external ground terminal, there is no longer any need for a bundling or collimating optical element for an LED matrix 1 when used in an application such as automotive front lighting.

Figure 3:
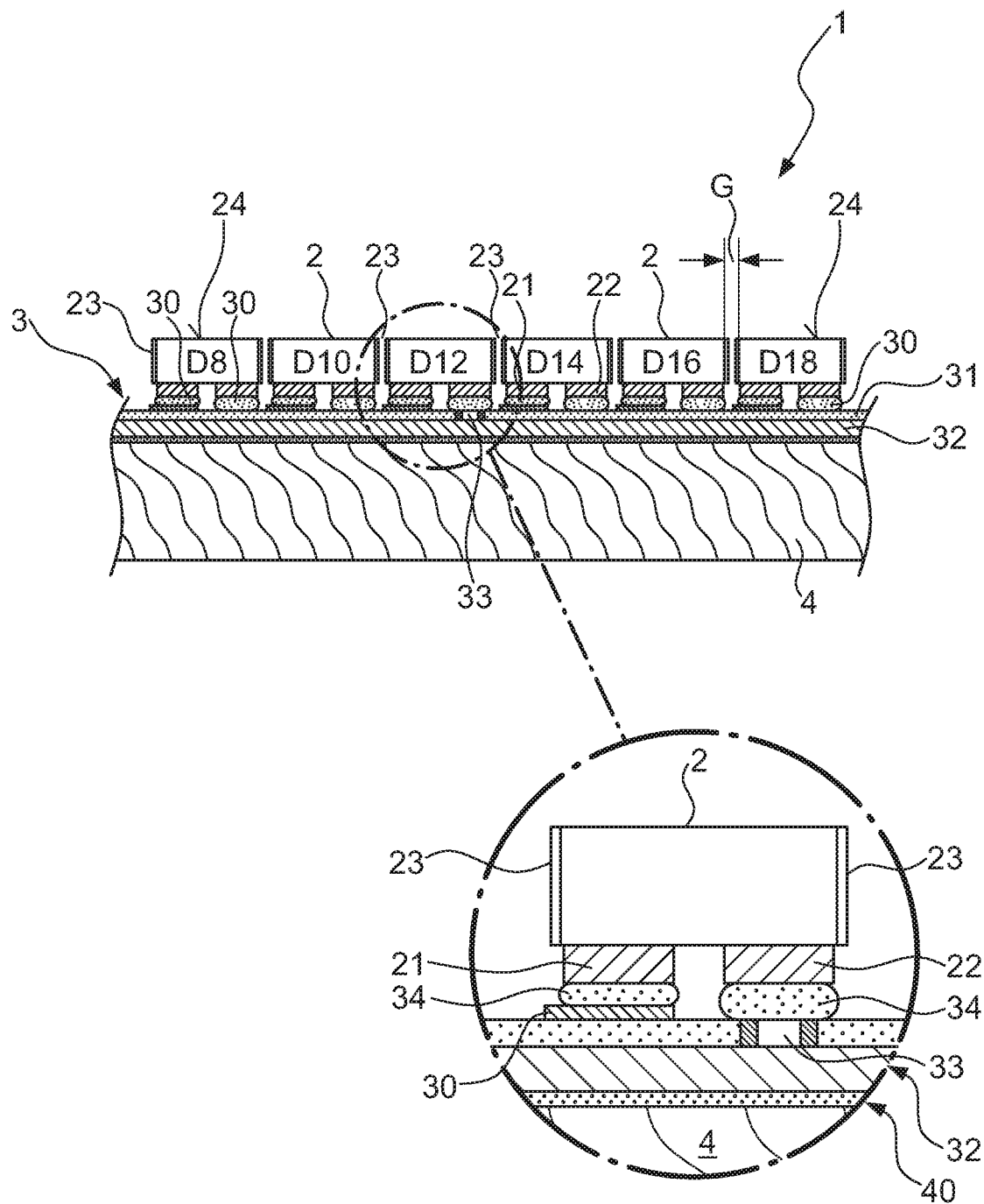
FIG. 3 shows a cross-section through the array of the LED lighting arrangement of FIG. 1.

FIG. 3 shows a cross-section through a part of a row of the array 1 of FIG. 1 when mounted on the single-layer PCB 3 of FIG. 2. In this preferred embodiment, the PCB 3 is realised as a single-layer metal-core printed circuit board (MCPCB) or insulated metal substrate (IMS). The diagram shows the dielectric layer 31 and the metal core 32 or base layer of the single-layer carrier 3. A cross-section is shown through six LEDs 2 labelled D8-D18 (LEDs D8, D10, D12 of the first string S1 in the second row R2, and LEDs D14, D16, D18 of the second string S2 in the second row R2). Each LED 2 is structurally identical and all LEDs 2 are arranged in the same direction, with an anode 21 on the left and a cathode 22 on the right. The anode 21 and cathode 22 of each LED 2 are soldered to tracks 30 on the surface of the single-layer PCB 3, which is mounted on a heatsink 4. The diagram shows the cathode 22 of the final LED (labelled D12) of the first string S1 connected electrically to the metal core 32 of the substrate 3 by means of a blind micro-via 33. This is shown in more detail in the enlarged portion of the diagram. The anode contact 21 is electrically connected to a conductive track 30 by a solder interconnect 34. The cathode contact 22 is electrically connected by a solder interconnect 34 to the upper end of a blind micro-via 33. The metal walls of the blind micro-via 33 are electrically (and thermally) connected to the metal core 32 of the PCB 3. This electrical connection does away with the need to leave room for a conductive track between the final cathode of a string and a ground terminal. A very close packaging can be achieved by giving the dies 2 a very thin side-coat 23 of less than 50 µm, preferably 10 µm or less, allowing a very narrow gap G of at most 50-100 µm. As described above, side-coats can be applied to the individual LEDs 2 before assembly of the lighting arrangement, or can be applied to the LEDs collectively after these are mounted to the carrier. The metal core 32 of the single-layer PCB 3 can be thermally bonded to the heatsink 4 using a suitable material 40 such as a thermal adhesive. In one embodiment, the metal core 32 and the heatsink may be electrically and thermally connected, and the heatsink 4 serves as electrical ground. In an alternative realisation, the interface between the metal core 31 and the heatsink 4 can comprise an electrically isolating material such as a dielectric.

Figure 4:
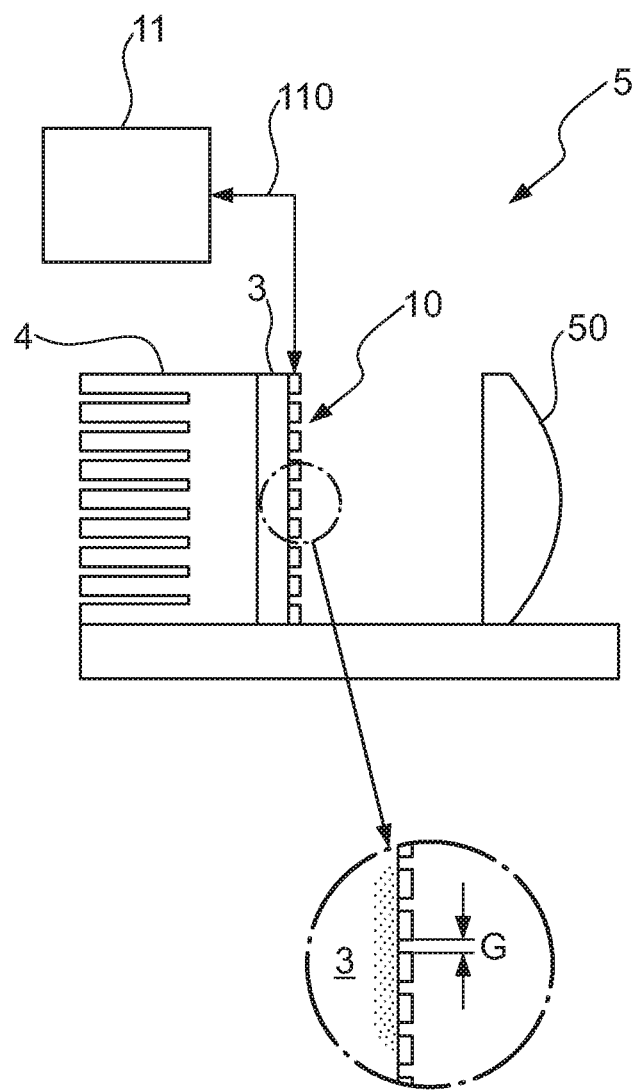
FIG. 4 shows an embodiment of the inventive LED lighting unit.

FIG. 4 shows an embodiment of the inventive LED lighting unit 5. The diagram shows relevant components of the lighting unit 5, namely an embodiment of the inventive LED lighting arrangement 10, an interface 110 for connecting the LEDs of the series-connected LED die package strings to control circuitry, and an imaging lens 50 arranged in the path of the light emitted by the LEDs of the series-connected LED die package strings. The LEDs are mounted on an MCPCB attached to a heat spreader. Because the LEDs are mounted very close together, and because adjacent LED arrays are also mounted very close together, the inventive LED lighting unit 5 does not need any collimating optical element that would otherwise be needed to manipulate the individual contributions of the LEDs and LED arrays to obtain a beam that can then be imaged by an imaging lens. An exemplary embodiment might comprise 4 strings of 12 LEDs mounted on a MCPCB with intervening gaps G of only 50 µm or less and covering a total area of 30 $mm^2$. The compact placement made possible by the inventive LED lighting arrangement can allow a more compact LED lighting unit 5 and/or can allow a greater number of LEDs to be deployed.

Figure 5:
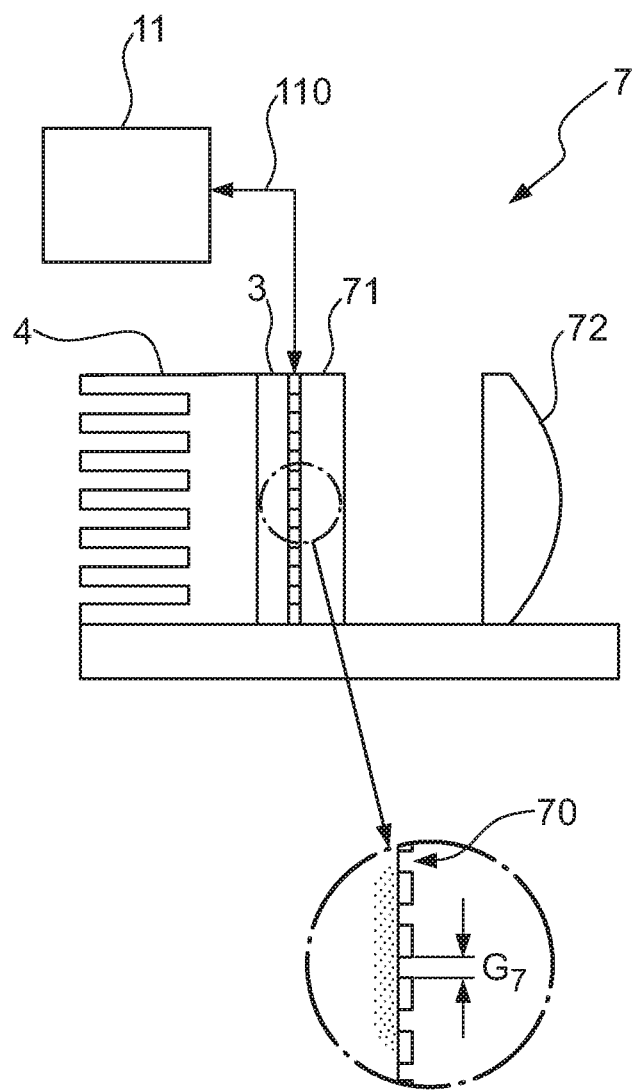
FIG. 5 shows a prior art LED lighting unit.

FIG. 5 shows an embodiment of a prior art LED lighting unit 7. Here also, the diagram only shows the relevant components, namely a prior art LED lighting arrangement 70 comprising several series-connected LED die package strings, and an interface 110 for connecting the LEDs to control circuitry. Because the LEDs of the prior art LED lighting arrangement 70 are spaced apart owing to thermal requirements and because adjacent LED arrays are spaced apart to accommodate a track for the final LED of a string, the prior art LED lighting unit 7 requires a collimating optical element 71 to manipulate the individual contributions of the LEDs and LED arrays to obtain a beam that can then be imaged by an imaging lens 72. An exemplary embodiment might comprise 4 strings of 12 LEDs mounted on a MCPCB. With a side-coat thickness of 200 µm, and an LED pitch or gap G7 of 1.2 mm, such an arrangement covers an area of 70 $mm^2$. This relatively large area arises from the need to provide sufficiently large gaps between adjacent LEDs and adjacent LED arrays, and can result in a correspondingly large LED lighting unit 7 and/or can place an upper limit on the total number of LEDs that may be deployed.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

REFERENCE SIGNS

LED die array 1
LED lighting arrangement 10
controller 11
control interface 110
LED die package 2
anode 21
cathode 22
side-coat 23
emission surface 24
single-layer MCPCB 3
conductive tracks 30
dielectric layer 31
metal core 32
micro-via 33
solder 34
thermal dissipation block 4
LED lighting unit 5
imaging lens 50
prior art LED lighting unit 7
prior art LED lighting arrangement 70 collimating optical element 71
imaging lens 72
series-connected string S1, S2, S3, S4
switch element T
row R1-R4
LED position D7-D36

What is claimed is:

1. A light-emitting diode (LED) lighting system comprising:
   a single-layer carrier comprising a mounting surface, a metal core, and a dielectric layer between the mounting surface and the metal core;
   a plurality of LED strings, each of the plurality of LED strings comprising a plurality of LEDs connected in series and arranged on the mounting surface in a two-dimensional array comprising at least two rows; and
   at least one micro-via extending through the dielectric layer of the single-layer carrier and electrically coupling a cathode of a last one of the series-connected LEDs in each of the plurality of LED strings to the metal core of the single-layer carrier.

2. The system according to claim 1, wherein the plurality of LEDs are surface-mount wafer-level LEDs comprising anode and cathode contacts.

3. The system according to claim 1, wherein each of the plurality of LEDs has a rated current density of at least 500 mA/mm2.

4. The system according to claim 1, wherein each of the plurality of LEDs has a rated current density of at least 1500 mA/mm2.

5. The system according to claim 1, wherein each of the plurality of LEDs further comprises a side coat with a thickness less than or equal to 100 μm.

6. The system according to claim 1, wherein each of the plurality of LEDs further comprises a side coat with a thickness less than or equal to 20 μm.

7. The system according to claim 1, wherein each of the plurality of LEDs further comprises a reflective side coat.

8. The system according to claim 1, wherein adjacent LEDs of the plurality of LEDs are separated by a gap less than or equal to 200 μm.

9. The system of claim 1, wherein adjacent LEDs of the plurality of LEDs are separated by a gap less than or equal to 100 μm.

10. The system of claim 1, wherein adjacent LEDs of the plurality of LEDs are separated by a gap less than or equal to 50 μm.

11. The system of claim 1, further comprising a switch for each LED of the plurality of LEDs.

12. The system according to claim 1, wherein the single-layer carrier one of an insulated metal substrate and a metal core printed circuit board.

13. The system according to claim 1, wherein the micro-via is copper-lined.

14. The system according to claim 1, wherein the micro-via has a diameter between 50 μm and 200 μm.

15. The system according to claim 1, wherein the plurality of LED strings comprises at least four LED strings, wherein each of the plurality of LED strings comprises at least ten LEDs.

16. The system according to claim 15, wherein each of the plurality of LED strings comprises at least twelve LEDs.

17. A light-emitting diode (LED) lighting system comprising:
   a single-layer carrier comprising a mounting surface, a metal core, and a dielectric layer between the mounting surface and the metal core;
   a plurality of LED strings, each of the plurality of LED strings comprising a plurality of LEDs connected in series and arranged on the mounting surface in a two-dimensional array comprising at least two rows;
   at least one micro-via extending through the dielectric layer of the single-layer carrier and electrically coupling a cathode of a last one of the series-connected LEDs in each of the plurality of LED strings to the metal core of the single-layer carrier;
   a control interface; and
   an imaging lens opposite the plurality of LEDs.

18. The system according to claim 17, wherein the plurality of strings of LEDs comprises four strings of twelve LEDs, the two-dimensional array is a 4×12 array, and each string is arranged in a 2×6 array configuration.

* * * * *